(12) United States Patent
Weese

(10) Patent No.: US 7,053,631 B2
(45) Date of Patent: May 30, 2006

(54) VSWR-MEASUREMENT WITH ERROR COMPENSATION

(75) Inventor: Kurt Weese, Ditzingen (DE)

(73) Assignee: Evolium S.A.S., Paris (FR)

( * ) Notice: Subject to any disclaimer, the term of this patent is extended or adjusted under 35 U.S.C. 154(b) by 237 days.

(21) Appl. No.: 10/728,994

(22) Filed: Dec. 8, 2003

(65) Prior Publication Data
US 2004/0132497 A1    Jul. 8, 2004

(30) Foreign Application Priority Data
Dec. 30, 2002    (EP)    ................................. 02360381

(51) Int. Cl.
*G01R 27/00*    (2006.01)
(52) U.S. Cl. .................................. 324/646; 455/562.1
(58) Field of Classification Search ..................... None
See application file for complete search history.

(56) References Cited

U.S. PATENT DOCUMENTS

| | | | |
|---|---|---|---|
| 3,020,529 A | 2/1962 | Turner | |
| 3,774,113 A * | 11/1973 | Chasek | ............... 455/226.4 |
| 4,110,685 A | 8/1978 | Leenerts | |
| 4,263,653 A | 4/1981 | Mecklenburg | |
| 4,584,650 A * | 4/1986 | Kozuch | ..................... 702/64 |
| 6,029,051 A | 2/2000 | Osterberg et al. | |
| 6,289,216 B1 | 9/2001 | Koh et al. | |
| 2002/0113600 A1* | 8/2002 | Swank, II | ..................... 324/637 |

* cited by examiner

Primary Examiner—Vincent Q. Nguyen
(74) Attorney, Agent, or Firm—Sughrue Mion, PLLC

(57) ABSTRACT

A method and base station apparatus are presented for calculating the Voltage Standing Wave Ratio of a radio frequency transmission line which is coupled with a first and a second directional coupler, the first directional coupler developing a first voltage indicative of the forward power propagating along the radio frequency transmission line in a first direction, the second directional coupler developing a second voltage indicative of a reflected power propagating along the radio frequency transmission line in a reverse direction. The method includes, in a second stage of installation, collecting values of the first and the second voltage, connecting at least one correction value with the second voltage to form a corrected second voltage, and forming the Voltage Standing Wave Ratio on the basis of the first voltage and the corrected second voltage. The correction value is obtained in a calibration process in a first stage of installation.

9 Claims, 1 Drawing Sheet

VSWR-MEASUREMENT WITH ERROR COMPENSATION

TECHNICAL FIELD

The present invention relates to a method of calculating the Voltage Standing Wave Ratio (VSWR) of a radio frequency transmission line which is operatively coupled with a first and a second directional coupler, the first directional coupler developing a first voltage indicative of the forward power propagating along the radio frequency transmission in a first direction, and the second directional coupler developing a second voltage indicative of a reflected power propagating along the radio frequency transmission line in a reverse direction. The invention is based on a priority application EP 02 360 381.4 which is hereby incorporated by reference.

BACKGROUND OF THE INVENTION

Further, the present invention relates to a base station in a mobile communication system comprising an antenna feeding line and a first and a second directional coupler that are operatively coupled with the antenna feeding line, the first directional coupler developing a first voltage indicative of the forward power propagating along the antenna feeding line in a first direction, the second directional coupler developing a second voltage indicative of a reflected power propagating along the antenna feeding line in a reverse direction.

Such a method and such a base station is per se known, for instance from U.S. Pat. No. 4,110,685.

SUMMARY OF THE INVENTION

In general, an RF-transmission system comprises a transmitter, an antenna and an RF transmission line that couples the transmitter to the antenna. For optimal power transmission, the impedances of these components have to be matched. If the impedance match were perfect, no fraction of the power propagating forward from the transmitter to the antenna would be reflected. In reality, however, a fraction of the power is reflected and propagates as a reflected wave in the reverse direction, thereby, giving rise to a standing wave on the transmission line by superposition of both the wave traveling forward and the reflected wave.

The Voltage Standing Wave Ratio (VSWR) is defined as $(1+U\_R/U\_F)/(1-U\_R/U\_F)$ wherein U_R represents a voltage developed by the first directional coupler and indicative of forward power, U_R the voltage developed by the second directional coupler indicative of reflected power.

Hence, the quality of the impedance match affects the VSWR. Accordingly, the VSWR is measured in order to monitor the performance of such a Radio Frequency (RF)-transmission system during operation.

The directional couplers utilized for providing the voltages U_F and U_R comprise conducting structures that are oriented in parallel and antiparallel to the transmission line and that extend along a part of the transmission line. The E- and H-components of the electromagnetic wave traveling along the transmission line couple to these structures and induce the respective voltages U_R, U_F therein.

If the conducting structures had a perfectly straight design and if they were perfectly oriented in parallel and antiparallel, the induced voltages U_F, U_R would depend only on the power of the wave propagating in a single direction, i.e. either forward or backward. The ability of a coupler to distinguish between waves propagating in directions that are reverse to each other is called directivity.

However, due to mechanical deviations from the perfect design and orientation, the wave propagating forward does not only couple to the particular directional coupler provided for developing the respective voltage U_F, but couples also to the other directional coupler. As a consequence, the voltage developed by the other directional coupler that should be indicative of the reflected power only is affected adversely, the other directional coupler, thereby, showing a sub-optimal directivity.

In principle, the same applies to the particular directional coupler provided for developing the voltage U_F indicative of the power propagating forward. This voltage may be adversely affected by the reflected power. Since the reflected power is, in general, small in comparison to the power propagating forward, the impact of the reflected power on the voltage U_F is negligible.

However, the opposite is true for the impact of the power propagating forward on the voltage U_R that is meant to be indicative of the reflected power. Since the reflected power is, in general, small, the voltage U_R might be affected severely by an unwanted impact of the greater power that propagates in the forward direction.

In order to keep this unwanted effect small, it is per se known to manufacture and install the directional couplers with high accuracy in order to achieve a high directivity.

Such a process is time consuming and expensive.

It is, in the light of the prior art outlined above the objective of the invention to provide for a method of measuring the Voltage Standing Wave Ratio (VSWR) of a radio frequency transmission line which reduces the dependency on the mechanical accuracy of the directional couplers involved, thereby reducing manufacturing and installation time and cost.

This objective is achieved by a method as mentioned at the outset, the method comprising the steps of, in a second stage of installation, collecting values of the first and the second voltage, connecting at least one correction value with the second voltage to form a corrected second voltage and forming the Voltage Standing Wave Ratio on the basis of the first voltage and the corrected second voltage.

Further, this objective is achieved by a base station as mentioned at the outset, the base station comprising a control unit receiving the first and the second voltage and having a memory wherein a predetermined correction factor is stored, the control unit forming a corrected second voltage in dependence on the predetermined correction factor, and forming the Voltage Standing Wave Ratio on the basis of the first voltage and the corrected second voltage.

Connecting the second collected voltages with correction values renders is possible to compensate for a lack of accuracy in acquisition of measurement values by utilizing correction values in the subsequent processing of these measurement values. As has already been mentioned, a lack of accuracy in measurement value acquisition may be caused, in the particular technical field of calculating the VSWR of a RF-transmission line from the output values of directional couplers, by a lack of precision in manufacturing and installing the couplers. The opportunity of compensating for a lack of mechanical precision electronically allows to reduce the otherwise required mechanical precision, thereby reducing cost and time in the manufacturing and installment process. In other words: According to the invention, a sub-optimal directivity of directional couplers is electronically compensated. The proposed solution allows for an improvement of a coupler's directivity of approximately 10 dB.

In order to achieve a good compensation, it is preferred to connect the at least one predetermined correction value with the second voltage additively.

Due to the additive nature of mechanically caused measurement value errors, an additive correction value provides for a good compensation.

Since the error induced in the output value of the second directional coupler is dependent on the power propagating forward on the transmission line, it is preferred to form the at least one correction value as being proportional to the first voltage. It should be kept in mind, in this context, that it is the first coupler that is designed to measure the forward power. Hence, the first voltage forms can be expected to reflect the forward power.

It is, further, preferred, to multiply the first voltage with a predetermined correction factor to form the correction value.

Accordingly, the predetermined correction factor may take those influences into account that are not dependent on the forward power, whereas the first voltage takes the dependency on the forward power into account.

In order to obtain a predetermined correction factor that matches the required compensation quality, it is preferred to terminate the radio frequency transmission line with a load resistance of a predetermined quality in a first stage of installation, to collect values of the first and the second voltage, to form a correction factor such, that a predetermined relationship between the first voltage, the second voltage and the correction factor is fulfilled, to store the correction factor, and, to utilize the stored correction factor in a second stage of installation. The first stage of installation is preferably an end of line stage in the manufacturing process of the transmission line and/or base station, whereas the second stage of installation refers to the normal operation of the transmission line and/or base station in the field.

To take the frequency dependency of mechanically induced measurement errors into account, it is preferred to form a plurality of correction factors, each correction factor being allocated to a predetermined frequency of the standing voltage wave.

It is further preferred to consider the predetermined relationship as fulfilled when the sum of the second voltage and the product of the first voltage and the correction factor is equal to zero.

It has turned out that it is this particular relationship that provides for good compensation results.

In order to obtain a good compensation quality, it is further preferred that a first and a second demodulator is interposed between the control unit and the first and second directional coupler, respectively.

The demodulator provides for a splitting up of the in-phase and quadrature-phase components of the coupler's output voltages reflecting both the forward propagating wave and the reflected wave, thereby offering the opportunity to compensate for errors in each individual in-phase and/or quadrature-phase component separately, thereby enhancing the compensation quality.

Further, a base station is preferred that implements at least one of the above outlined methods.

Further advantages can be taken from the description and the enclosed drawings.

It is to be understood that the features mentioned above and those yet to be explained below can be used not only in the respective combinations indicated, but also in other combinations or in isolation, without leaving the scope of the present invention.

BRIEF DESCRIPTION OF THE DRAWINGS

Embodiments of the invention are shown in the drawings and will be explained in more detail in the description below. In the drawings.

DETAILED DESCRIPTION OF PREFERRED EMBODIMENTS

Figure 1:
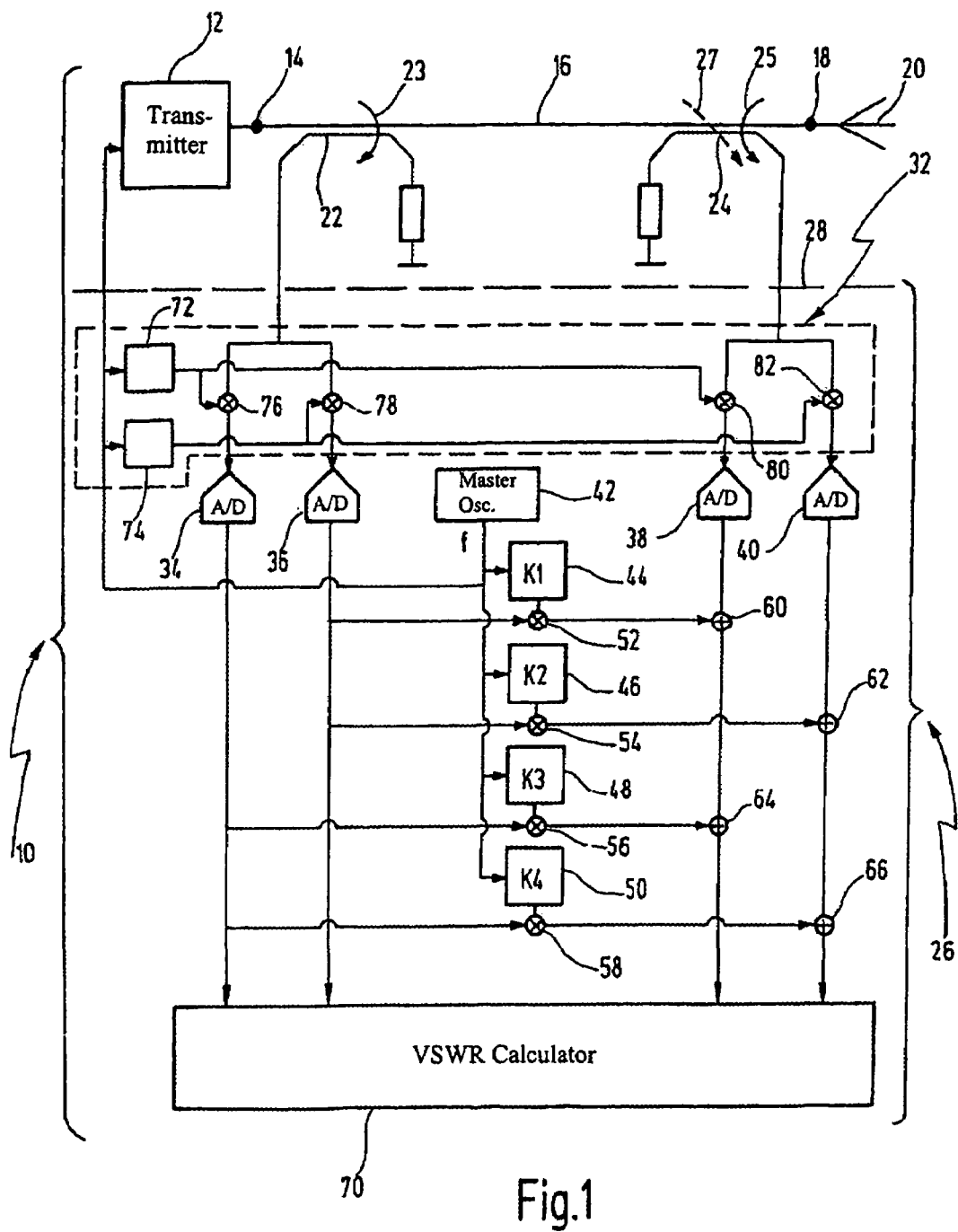
FIG. 1 depicts, schematically, an embodiment of the invention in the form of functional blocks.

FIG. 1 schematically depicts an exemplary embodiment of a base station in a mobile communication system in the form of functional blocks. The base station in its entirety is designated by 10. Base station 10 comprises a transmitter 12 which is coupled to a first end 14 of a RF-transmission line 16. The second end 18 of transmission line 16 is coupled to an antenna 20.

A first directional coupler 22 is operatively coupled to transmission line 16 in order to develop a signal, e.g. a voltage, that is indicative of the power propagating forward from transmitter 12 to antenna 20 on transmission line 16.

Further, a second directional coupler 24 is operatively coupled to transmission line 16 in order to develop a respective signal indicative of the reflected power, that is the power of the wave that has been reflected at antenna 20 and propagates backwards from antenna 20 to transmitter 12 on transmission line 16.

In general, the coupling effect is characterized by a quantity K which is defined by the equation K equal to ten times the logarithm (base 10) of the ratio of the power propagating on the transmission line in a certain direction, to the power that is coupled out.

Further, the directivity D of a directional coupler is defined as D plus K equal to ten times the logarithm (base 10) of the ratio of the power that is coupled out.

Arrow 23 represents a coupling interaction of desired direction, that is an transfer of a part of the energy propagating forward on transmission line 16 to first coupler 22.

Likewise, arrow 25 represents a coupling interaction of desired direction, that is an transfer of a part of the reflected energy propagating backwards on transmission line 16 to second coupler 24.

For reasons mentioned above, an the second coupler 24 may additionally couple with the power propagating forward on transmission line 16. Such an undesired coupling interaction that may give rise to an unwanted contribution to the voltage developed by the second directional coupler 24 that is not negligible. Arrow 27 represents such an impact.

Identification reference 26 designates a control unit. Control unit 26, inter alia, calculates the Voltage Standing Wave Ratio (VSWR) on the basis of output signals, e.g. voltages, of the first directional coupler 22 and the second directional coupler 24. In FIG. 1 all elements below dashed line 28 are allocated to control unit 26. Control unit 26 comprises a demodulator 32, which is enframed by dashed line 30, analog to digital-converters 34, 36, 38, 40, a master oscillator 42, maps or memory cells 44, 46, 48, 50, multiplicative combinational elements 52, 54, 56, 58, additive combinational elements 60, 62, 64, 66 and a block 70 that represents the calculation of the Voltage Standing Wave Ratio based on processed output signals of first directional coupler 22 and second directional coupler 24.

Master oscillator 42 provides a reference frequency f for transmitter 12 and, inter alia, demodulator 32. Based on this reference frequency f, transmitter 12 generates a signal wave and feeds the signal wave to first end 14 of transmission line 16. The energy of this signal wave is partly emitted by antenna 20 and partly reflected, thereby giving rise to a standing wave on transmission line 16. To measure the Voltage Standing Wave Ratio, i.e. the ratio of the maximum and minimum voltage of the standing wave, directional couplers 22 and 24 are provided. Directional coupler 22 is designed and oriented to develop a signal of the power propagating towards the antenna. Likewise, directional coupler 24 is designed and oriented to develop a signal indicative of the reflected power propagating back to transmitter 12.

The output signal of the first directional coupler 22 is fed to demodulator 32 in order to be decomposited into its in-phase components and quadrature-phase components. To this purpose, generator 72 generates a first demodulation signal, e.g. a cosine of frequency f. Frequency f is provided by master oscillator 42. The cosine outputted by generator 72 is multiplied, in combinational element 76 with the output voltage U_F (U_forward) of first directional coupler 22. Accordingly, the resulting product represents the in-phase component of U_F.

Generator 74 generates a sine with frequency f. Accordingly, the product of the sine generated by generator 74 and the output voltage U_F of the first directional coupler 22, which is formed in combinational element 78, represents the quadrature-phase component of U_F.

The output of generator 72 is, further, multiplicatively combined with the output voltage U_R of the second directional coupler 24 in combinational element 80. Likewise, the output of generator 74 is combined multiplicatively in combinational element 82 with the output O_R of the second directional coupler 24. Hence, combinational element 80 provides for the in-phase component of U_R and combinational element 82 provides for the quadrature-phase component of U_F.

The in-phase components and quadrature-phase components of signals U_F, U_R are converted to digital signals in analog to digital converters 34, 36, 38 and 40. The digitized signals based on U_F are fed, without further processing, into block 70, in which the Voltage Standing Wave Ratio VSWR is calculated. Accordingly, the digitized signals based on U_F are processed without being corrected for a potential impact of the reflected power. This is acceptable, since, for reasons outlined above, the output voltage U_F of the first directional coupler 22 is not affected severely by the reflected energy propagating transmitter 12 on transmission line 16.

However, converse considerations apply to the output voltage U_R of the second directional coupler 24. In fact, this output voltage U_R may be affected severely by the power propagated forward to the antenna 20. The purpose of second directional coupler 24 is to develop a voltage indicative of the reflected power only. However, the reflected power is, in general, small in comparison to the power propagating in forward direction. Accordingly, a small fraction of power propagating forward on transmission line 16 may induce a severe disturbance to the small signal indicative of the reflected power and outputted by directional coupler 22. Hence, if such a disturbance occurs, the output signal O_R has to be corrected in order to calculate the Voltage Standing Wave Ratio correctly.

To accomplish such a correction, correction factors K1, K2, K3 and K4 are stored in memory cells 44, 46, 48 and 50, respectively.

Correction factor K1 is multiplied with the quadrature-phase component of U_F in combinational element 52. The resulting product is added to the in-phase component of U_R in combinational element 60. Similarly, the quadrature-phase component of U_F is multiplied with a correction factor K2 outputted by memory cell 46 in combinational element 54 and added to the quadrature-phase component of U_R in combinational element 62.

Further, the in-phase component of U_F is multiplied in combinational element 56 with a correction factor K3 read out from memory cell 48 and the resulting product is added to the in-phase component U_R in combinational element 64. Similarly, the in-phase component of U_R is multiplied in combinational element 58 with correction factor K4 read out from memory cell 50 and the resulting product is added to the quadrature-phase component of U_R in combinational element 66.

Memory cells 44, 46, 48 and 50 may be comprised in respective maps that may be addressed by the reference frequency f provided by master oscillator 42. Such a design takes the frequency-dependence of the correction factors K1, . . . K4 into account.

As a consequence, the in-phase and quadrature-phase components of U_R may be compensated for a disturbance caused by a lack of mechanical precision in manufacturing and installing the second directional coupler 24 electronically.

FIG. 1 shows the base station 10 in a second stage of installation, i.e. during normal operation in the field with an antenna 20 attached.

To establish correct values for the correction factors K1, . . . K4, base station 10 is, in a first stage of installation, calibrated. For calibration, antenna 20 is substituted by a defined impedance that generates a defined reflection at the second end 18 of transmission line 16. Accordingly, a defined Voltage Standing Wave Ratio on transmission line 16 is generated.

For instance, the calibration impedance terminating transmission line 16 may be designed to generate zero reflection. Accordingly, the voltage U_R developed by the second directional coupler 24 should be zero. Any voltage developed by the second directional coupler 24 under these circumstances is induced by the power propagating forward on transmission line 16 due to a lack of mechanical accuracy in the design and/or installation/orientation of second directional coupler 24.

To obtain appropriate correction values, the requirement $U\_R + K^* \cdot U\_F = 0$ is established. In complex notation, U_R can be written as the sum of the in-phase component and the quadrature-phase component times the complex number j. In complex notation, U_F can be written as $AI + j^*AQ$ wherein AI represents the in-phase component of U_F and AQ represents the quadrature_phase component.

Similarly, U_R can be written as $BI + j^*BQ$ and K can be written as $K = KI + j^*KQ$.

Substituting the respective variables in the equation mentioned above leads to:

$$-BI = KI^*AI - KQ^*AQ \text{ and}$$

$$-BQ = KI^*AQ + KQ^*AI.$$

Accordingly, the unknown coefficients KI, KQ can be calculated from the values of BI, BQ, AI, and AQ that are measured in the first stage of installation in a calibration procedure.

A comparison with the relationships established by the structure of FIG. 1 shows that K1 equals KQ,
K2 equals −KI,
K3 equals −KI, and
K4 equals −KQ.

Accordingly, the correction factors K1, ..., K4 may be pre-determined in a calibration process in the manner outlined above. Preferably, the calibration process is integrated in an end of line test procedure after in the manufacturing process.

The invention claimed is:

1. A method of calculating the Voltage Standing Wave Ratio of a radio frequency transmission line which is operatively coupled with a first and a second directional coupler, the first directional coupler developing a first voltage indicative of the forward power propagating along the radio frequency transmission line in a first direction, the second directional coupler developing a second voltage indicative of a reflected power propagating along the radio frequency transmission line in a reverse direction, the method comprising:

in a second stage of installation, collecting values of the first and the second voltage,
connecting at least one correction value with the second voltage to form a corrected second voltage, and
forming the Voltage Standing Wave Ratio on the basis of the first voltage and the corrected second voltage.

2. The method of claim 1, wherein the at least one correction value is connected with the second voltage additively.

3. The method of claim 1, wherein the at least one correction value is proportional to the first voltage.

4. The method of claim 3, wherein the first voltage is multiplied with a predetermined correction factor to form the correction value.

5. The method of claim 1, further comprising, in a first stage of installation, terminating the radio frequency transmission line with a load resistance of a predetermined quality, collecting values of the first and the second voltage, forming a correction factor such, that a predetermined relationship between the first voltage, the second voltage and the correction factor is fulfilled, storing the correction factor, and, utilizing the stored correction factor in a second stage of installation.

6. The method of claim 5, wherein a plurality of correction factors is formed, each correction factor being allocated to a predetermined frequency of the standing voltage wave.

7. The method of claim 5, wherein the predetermined relationship is fulfilled when the sum of the second voltage and the product of the first voltage and the correction factor is equal to zero.

8. A base station in a mobile communication system comprising an antenna feeding line and a first and a second directional coupler that are operatively coupled with the antenna feeding line, the first directional coupler developing a first voltage indicative of the forward power propagating along the antenna feeding line in a first direction, the second directional coupler developing a second voltage indicative of a reflected power propagating along the antenna feeding line in a reverse direction, whereby a control unit receiving the first and the second voltage and having a memory wherein a predetermined correction factor is stored, the control unit forming a corrected second voltage in dependence on the predetermined correction factor, and forming the Voltage Standing Wave Ratio on the basis of the first voltage and the corrected second voltage.

9. The base station of claim 8, whereby a demodulator interposed between the control unit and the first and second directional coupler, respectively.

* * * * *